(12) United States Patent
Nishida et al.

(10) Patent No.: US 10,468,115 B2
(45) Date of Patent: Nov. 5, 2019

(54) PROCESSOR AND CONTROL METHOD OF PROCESSOR

(71) Applicant: FUJITSU LIMITED, Kawasaki-shi, Kanagawa (JP)

(72) Inventors: Keisuke Nishida, Yokohama (JP); Shiro Kamoshida, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 121 days.

(21) Appl. No.: 15/897,242

(22) Filed: Feb. 15, 2018

(65) Prior Publication Data

US 2018/0253354 A1 Sep. 6, 2018

(30) Foreign Application Priority Data

Mar. 3, 2017 (JP) .................. 2017-040528

(51) Int. Cl.
*G11C 29/42* (2006.01)
*G06F 11/10* (2006.01)

(52) U.S. Cl.
CPC .......... *G11C 29/42* (2013.01); *G06F 11/1004* (2013.01); *G06F 11/1048* (2013.01); *G06F 11/1076* (2013.01)

(58) Field of Classification Search
None
See application file for complete search history.

(56) References Cited

U.S. PATENT DOCUMENTS

| | | | | |
|---|---|---|---|---|
| 7,467,337 B2* | 12/2008 | Nakamura | .............. | G11C 29/42 714/704 |
| 9,191,030 B2* | 11/2015 | Sakata | ................ | G06F 11/1004 |
| 2004/0225928 A1 | 11/2004 | Miyagi | | |
| 2011/0119558 A1* | 5/2011 | Koshiyama | ......... | G06F 11/1048 714/758 |
| 2012/0131382 A1* | 5/2012 | Higeta | ................ | G06F 11/0724 714/6.13 |
| 2013/0179751 A1* | 7/2013 | Linstadt | .............. | G06F 11/1048 714/763 |
| 2014/0095962 A1* | 4/2014 | Moon | ................. | G06F 11/1048 714/773 |
| 2015/0234706 A1* | 8/2015 | Alrod | .................. | G06F 11/1072 714/704 |
| 2016/0188429 A1* | 6/2016 | Noguchi | ................ | G11C 29/52 714/6.21 |

FOREIGN PATENT DOCUMENTS

| | | |
|---|---|---|
| JP | 9-16499 | 1/1997 |
| JP | 2002-157168 | 5/2002 |

* cited by examiner

*Primary Examiner* — Steve N Nguyen
(74) *Attorney, Agent, or Firm* — Fujitsu Patent Center

(57) ABSTRACT

A processor includes: an error checking and correcting information generating unit; a storage unit configured to store data to which error checking and correcting information and error uncorrectable information are added when an error is detected and configured to store data to which error checking and correcting information is added when an error is not detected; and a processing unit configured to read out all data which the storage unit stores and configured to check an error of each piece of read-out data based on error checking/correcting information added to each piece of all the read-out data when an arithmetic unit detects an error, and configured to correct data in which an error is detected based on error checking and correcting information when a correctable error is detected.

10 Claims, 9 Drawing Sheets

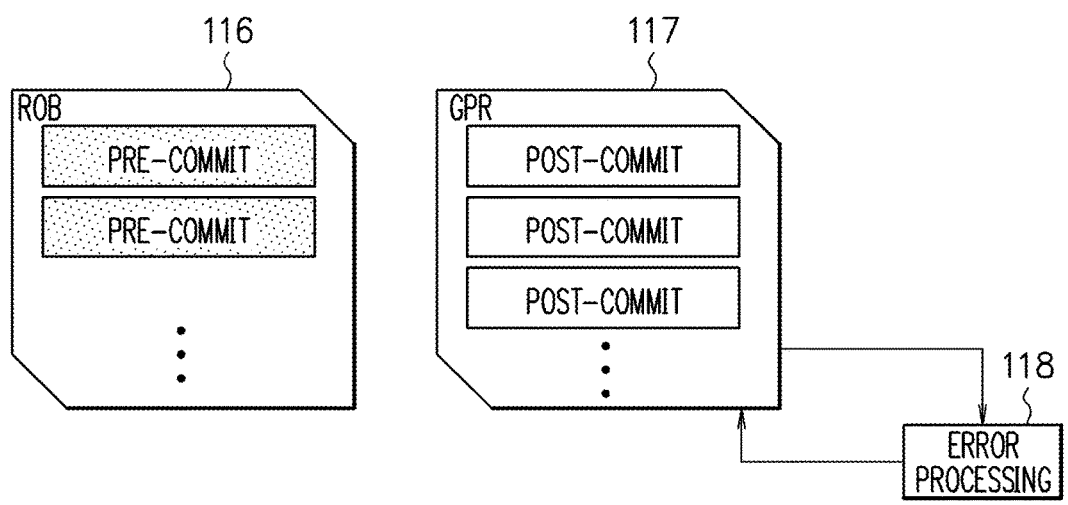
F I G. 5A
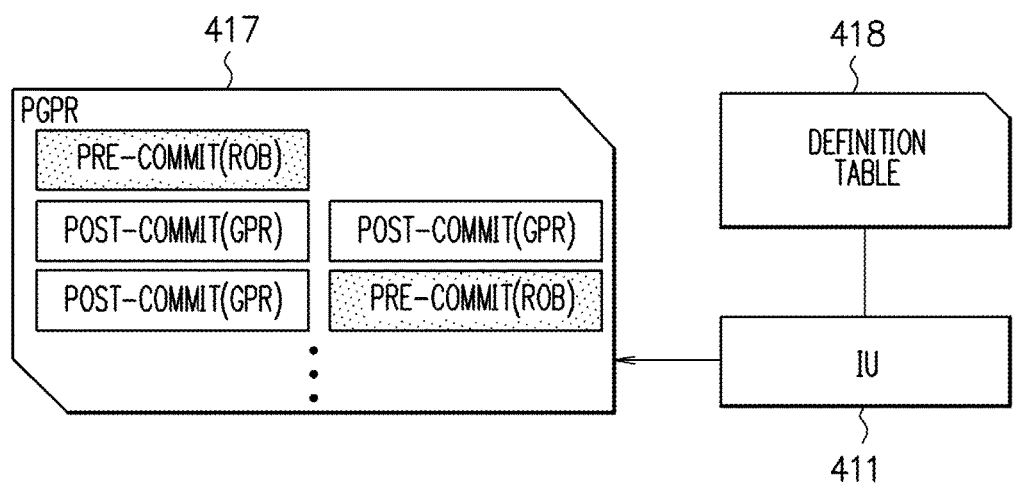
F I G. 5B

F I G. 7A
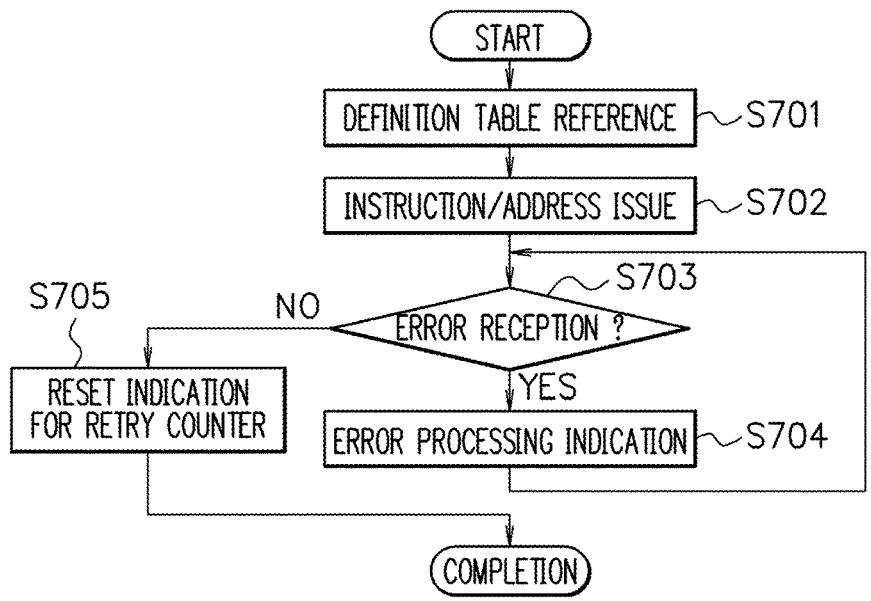
F I G. 7B
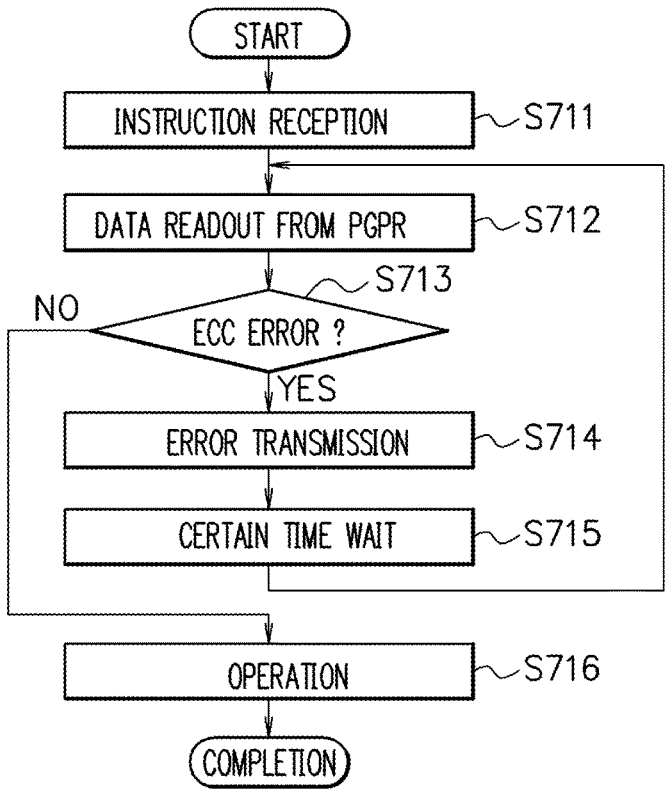

F I G. 8
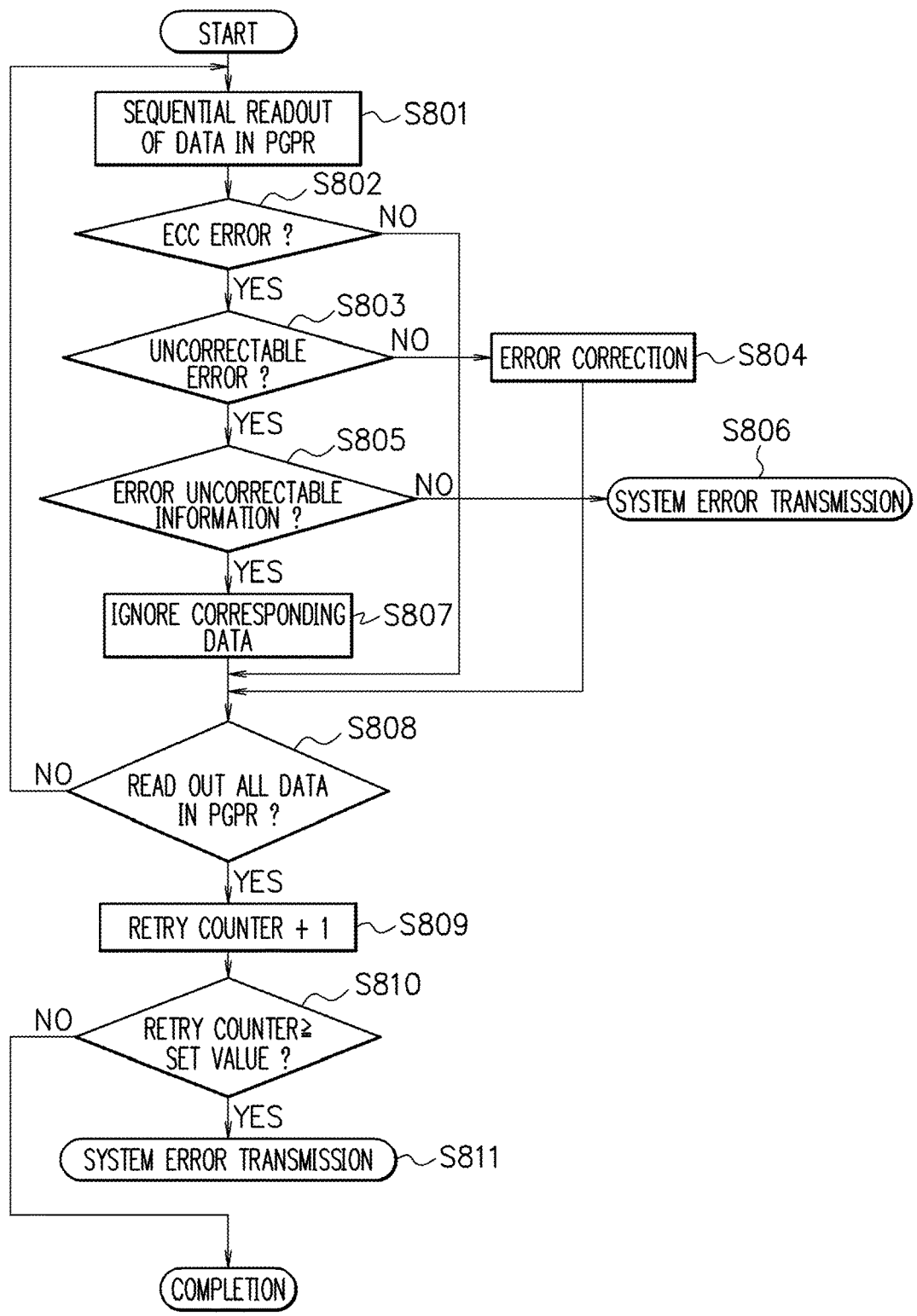

US 10,468,115 B2

PROCESSOR AND CONTROL METHOD OF PROCESSOR

CROSS-REFERENCE TO RELATED APPLICATION

This application is based upon and claims the benefit of priority of the prior Japanese Patent Application No. 2017-040528, filed on Mar. 3, 2017, the entire contents of which are incorporated herein by reference.

FIELD

The embodiments discussed herein are directed to a processor and a control method of a processor.

BACKGROUND

There has been known a memory system including a memory in which the same management information is stored in a plurality of regions with three or more regions (refer to Patent Document 1). A management information reading unit reads out the management information stored in each of the plurality of regions. A management information comparing unit compares a plurality of pieces of management information read out by the management information reading unit. A first error detection unit detects occurrence of an error when a disaccord judgment is made in a comparison operation by the management information comparing unit.

Further, there has been known a communication control unit which divides a memory area into an OS management area and a user area and performs mapping with transactions of the respective areas being one to one (refer to Patent Document 2). A user can obtain access to only the user area and an OS is allowed to have access to both the areas. The communication control unit assigns the transaction in the user area which the user wants to hunt, and performs abnormality detection of the transaction which the user wants to release based on mapping information in the OS management area.

[Patent Document 1] Japanese Laid-open Patent Publication No. 2002-157168

[Patent Document 2] Japanese Laid-open Patent Publication No. 09-16499

A processor includes a work register which stores pre-commit data and a general purpose register which stores post-commit data. However, in the processor, including both the work register and the general purpose register leads to an increase in an area and a power consumption of the processor.

SUMMARY

A processor includes: a first error check unit configured to check an error of received data based on error check information; a first error checking and correcting information generating unit configured to add error checking and correcting information and error uncorrectable information to the received data to output when the first error check unit detects an error and configured to add error checking and correcting information to the received data to output when the first error check unit does not detect an error; a storage unit configured to store data to which the error checking and correcting information and the error uncorrectable information are added when the first error check unit detects an error and configured to store data to which the error checking and correcting information is added when the first error check unit does not detect an error; an instruction control unit configured to store data after completion in the storage unit in instruction order when data before completion which the storage unit stores is completed; an arithmetic unit configured to read out data which the storage unit stores, configured to check an error of the read-out data based on the error checking and correcting information added to the read-out data, and configured to perform an operation based on the read-out data when an error is not detected; and a processing unit configured to read out all data which the storage unit stores and configured to check an error of each piece of read-out data based on error checking and correcting information added to each piece of all the read-out data when the arithmetic unit detects an error, and configured to correct data in which an error is detected based on the error checking and correcting information when a correctable error is detected.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 5A is a diagram illustrating a work register (ROB), a general purpose register (GPR), and an error processing circuit in FIG. 1 and FIG. 5B is a diagram illustrating a register (PGPR), an instruction control unit, and a definition table in FIG. 4.

FIG. 7A is a flowchart illustrating a control method of an instruction control unit and FIG. 7B is a flowchart illustrating a control method of an arithmetic unit.

FIG. 8 is a flowchart illustrating a control method of an error processing circuit.

DESCRIPTION OF EMBODIMENTS

Comparative Example

Figure 1:
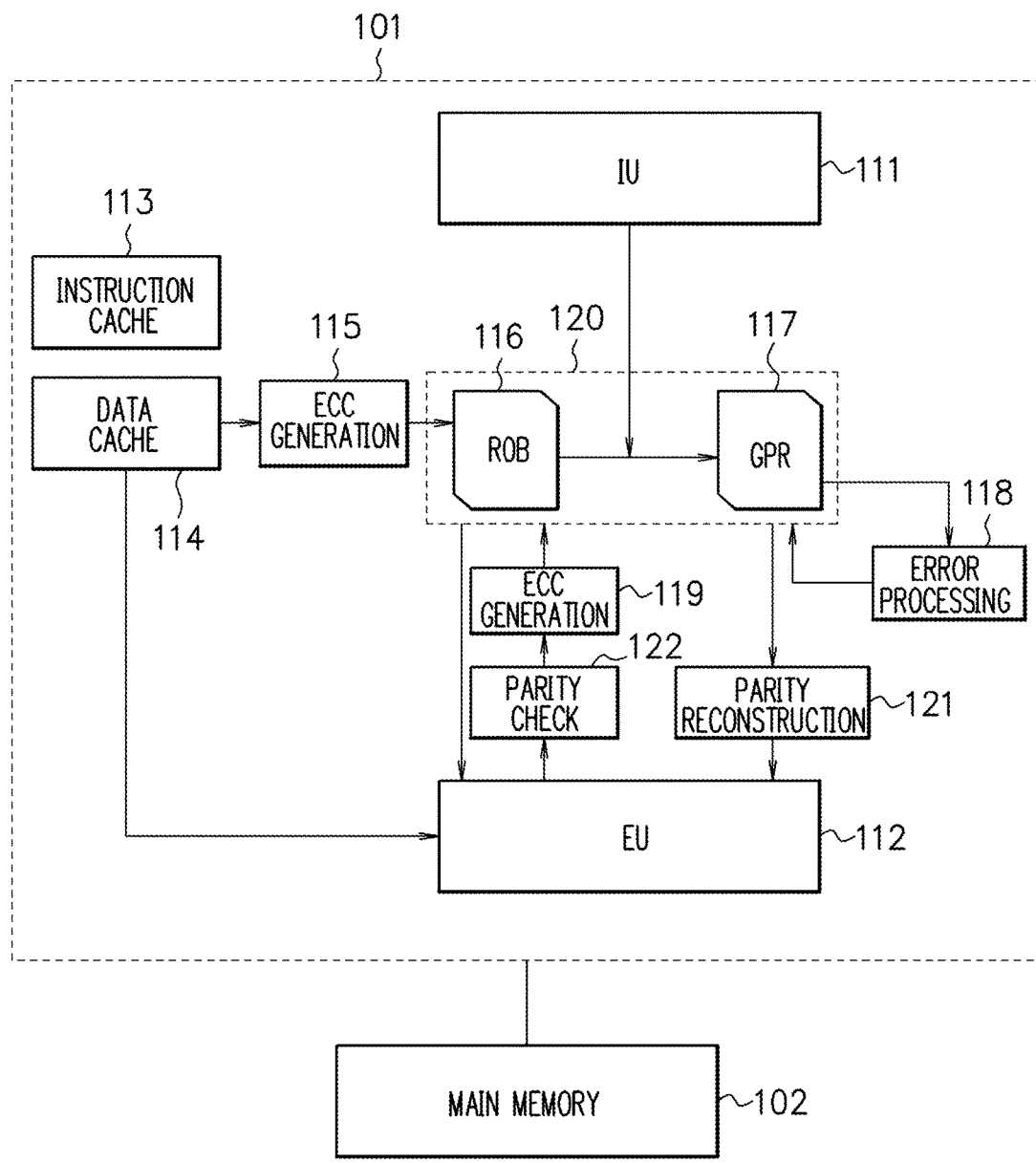
FIG. 1 is a diagram illustrating a configuration example of a processor according to a comparative example.

FIG. 1 is a diagram illustrating a configuration example of a processor 101 according to a comparative example. The processor 101 is connected to a main memory 102 and includes an instruction control unit 111, an arithmetic unit 112, an instruction cache memory 113, a data cache memory 114, a first error checking/correcting information generating circuit 115, a register group 120, an error processing circuit 118, a second error checking/correcting information generating circuit 119, a parity reconstruction circuit 121, and a parity check circuit 122. The instruction control unit 111 is an instruction unit (IU). The arithmetic unit 112 is an execution unit (EU). The register group 120 includes a work register 116 and a general purpose register 117. The work register 116 is a re order buffer (ROB). The general purpose register 117 is a general purpose register (GPR).

The instruction cache memory 113 stores some instructions of instructions stored in the main memory 102. The data cache memory 114 stores some data (including parity bits) of data stored in the main memory 102. The instruction control unit 111 reads out a load instruction stored in the instruction cache memory 113 and executes the load instruction. Specifically, the instruction control unit 111 reads out the data stored in the data cache memory 114 and writes the read-out data in the work register (ROB) 116 via the first error checking/correcting information generating circuit 115. The first error checking/correcting information generating circuit 115 generates error checking/correcting information (ECC information) based on the data read out from the data cache memory 114 and outputs data to which the error checking/correcting information is added to the work register (ROB) 116. The error checking/correcting information is information for detecting an error of data and correcting the detected error.

The work register (ROB) 116 stores the data to which the error checking/correcting information is added as pre-commit (before completion) data. The instruction control unit 111 is capable of performing out-of-order execution. In addition, for example, when the instruction control unit 111 executes double load instructions mistakenly, there is a case where data destruction is caused and invalid error data is written in the work register (ROB) 116. Therefore, the instruction control unit 111 commits (completes) only valid data in the work register (ROB) 116 in instruction order and writes post-commit (after completion) data in the general purpose register (GPR) 117.

Figure 2A:
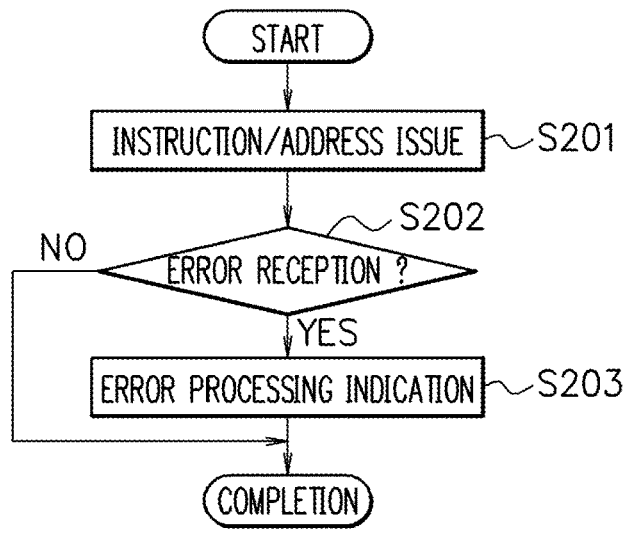
FIG. 2A is a flowchart illustrating a control method of an instruction control unit and FIG. 2B is a flowchart illustrating a control method of an arithmetic unit.
Figure 2B:
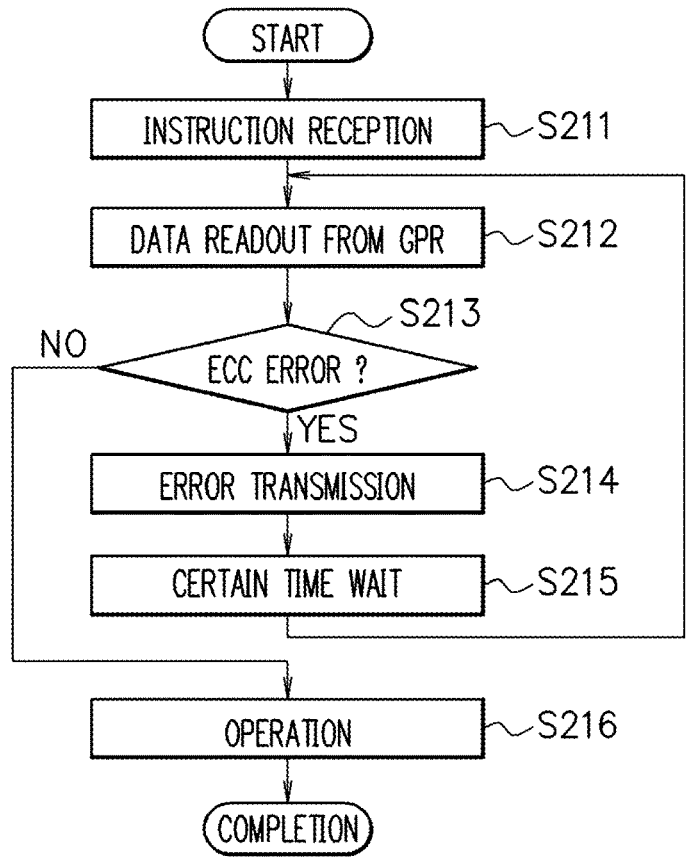
Figure 3:
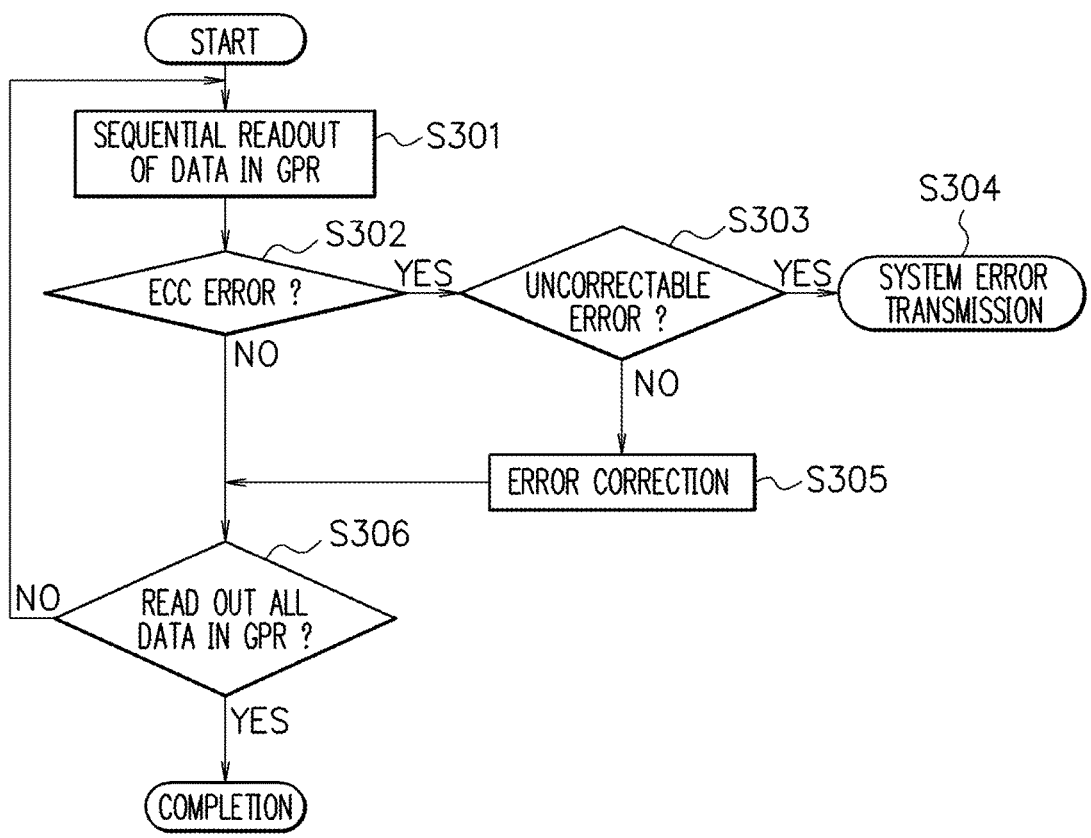
FIG. 3 is a flowchart illustrating a control method of an error processing circuit.

FIG. 2A, FIG. 2B, and FIG. 3 are flowcharts illustrating a control method of the processor 101 in FIG. 1. FIG. 2A is the flowchart illustrating the control method of the instruction control unit 111. FIG. 2B is the flowchart illustrating the control method of the arithmetic unit 112. FIG. 3 is the flowchart illustrating the control method of the error processing circuit 118.

First, at Step S201 in FIG. 2A, the instruction control unit 111 issues an operation instruction including a read address and a write address to the arithmetic unit 112. The read address is an address in the general purpose register (GPR) 117. The write address is an address in the work register (ROB) 116.

Next, at Step S211 in FIG. 2B, the arithmetic unit 112 receives the operation instruction including the read address and the write address. Next, at Step S212, the arithmetic unit 112 reads out data to which error checking/correcting information is added from the address in the general purpose register (GPR) 117 which the read address indicates via the parity reconstruction circuit 121. Next, at Step S213, the arithmetic unit 112 checks an error of the data based on the error checking/correcting information, proceeds with processing to Step S216 when the error is not detected, and proceeds with processing to Step S214 when the error is detected.

At Step S216, the arithmetic unit 112 performs an operation based on the read-out data. Then, the arithmetic unit 112 writes the data after the operation in the address in the work register (ROB) 116 which the write address indicates via the parity check circuit 122 and the second error checking/correcting information generating circuit 119. The second error checking/correcting information generating circuit 119 generates error checking/correcting information based on the data operated by the arithmetic unit 112 and outputs the data to which the error checking/correcting information is added to the work register (ROB) 116. The work register (ROB) 116 stores the data to which the error checking/correcting information is added as pre-commit data. Thereafter, the instruction control unit 111 commits the pre-commit data in the work register (ROB) 116 and writes post-commit data in the general purpose register (GPR) 117. In contrast, at Step S214, the arithmetic unit 112 transmits error information to the instruction control unit 111.

At Step S202 in FIG. 2A, the instruction control unit 111 judges whether or not to receive the error information in a certain time, proceeds with processing to Step S203 when the error information is received, and completes the processing when the error information is not received. At Step S203, the instruction control unit 111 indicates a start of error processing with respect to the error processing circuit 118 and completes the processing.

The error processing circuit 118 starts processing in FIG. 3 when it receives the indication of the start of the error processing from the instruction control unit 111. At Step S301, the error processing circuit 118 sequentially reads out all data in the general purpose register (GPR) 117. Next, at Step S302, the error processing circuit 118 checks the error of the read-out data based on the error checking/correcting information added to the read-out data. Then, the error processing circuit 118 proceeds with processing to Step S303 when the error is detected and proceeds with processing to Step S306 when the error is not detected.

At Step S303, the error processing circuit 118 judges whether the detected error is either of a correctable error and an uncorrectable error. For example, when the data is a 1-bit error, the error processing circuit 118 is capable of detecting and correcting the error. Further, when the data is a 2-bit error, the error processing circuit 118 is capable of detecting the error and incapable of correcting the error. In addition, when the data is an error of 3 or more bits, the error processing circuit 118 is sometimes not capable of detecting the error. The error processing circuit 118 proceeds with processing to Step S305 when the detected error is the correctable error (1-bit error) and proceeds with processing to Step S304 when the detected error is the uncorrectable error (2-bit error).

At Step S304, the error processing circuit 118 transmits a system error via the instruction control unit 111 to a higher device. At Step S305, the error processing circuit 118 corrects the data based on the error checking/correcting information and proceeds with processing to Step S306. At Step S306, the error processing circuit 118 judges whether or not to read out all the data in the general purpose register (GPR) 117. Then, when the error processing circuit 118 fails to read out all the data, it returns to Step S301, reads out the next data in the general purpose register (GPR) 117, and repeats the above-described processing. Further, when the error processing circuit 118 reads out all the data, it completes the processing and transitions to processing at Step S215 in FIG. 2B.

At Step S215 in FIG. 2B, the arithmetic unit 112 waits for a certain time until the processing of the error processing circuit 118 in FIG. 3 is completed and thereafter returns the processing to Step S212. At Step S212, the arithmetic unit 112 reads out the data in the general purpose register (GPR) 117 which the read address indicates. The read-out data is error-corrected at Step S305. Next, at Step S213, the arithmetic unit 112 checks the error of the data based on the error checking/correcting information added to the read-out data. Since the read-out data is error-corrected, the arithmetic unit 112 does not detect the error and performs the operation based on the read-out data at Step S216.

Here, in FIG. 3, the reason why the error processing circuit 118 performs the above-described processing with respect to not only the data which the arithmetic unit 112 reads out at Step S212 in FIG. 2B but also all the data in the general purpose register (GPR) 117 is explained. When the data which the arithmetic unit 112 reads out from the general purpose register (GPR) 117 at Step S212 is an error, there is a possibility that data generated based on the data of the error is stored in the general purpose register (GPR) 117. A possibility that the data generated based on the data of the error is error data is high. That is, when the data which the arithmetic unit 112 reads out from the general purpose register (GPR) 117 is an error, there is a possibility that other data in the general purpose register (GPR) 117 is also an error. Therefore, the error processing circuit 118 performs the processing in FIG. 3 with respect to all the data in the general purpose register (GPR) 117.

Note that other than the arithmetic unit 112 reads out data from the general purpose register (GPR) 117, it is also capable of reading out data from the data cache memory 114 or the work register (ROB) 116 in order to speed up the processing.

Embodiment

Figure 4:
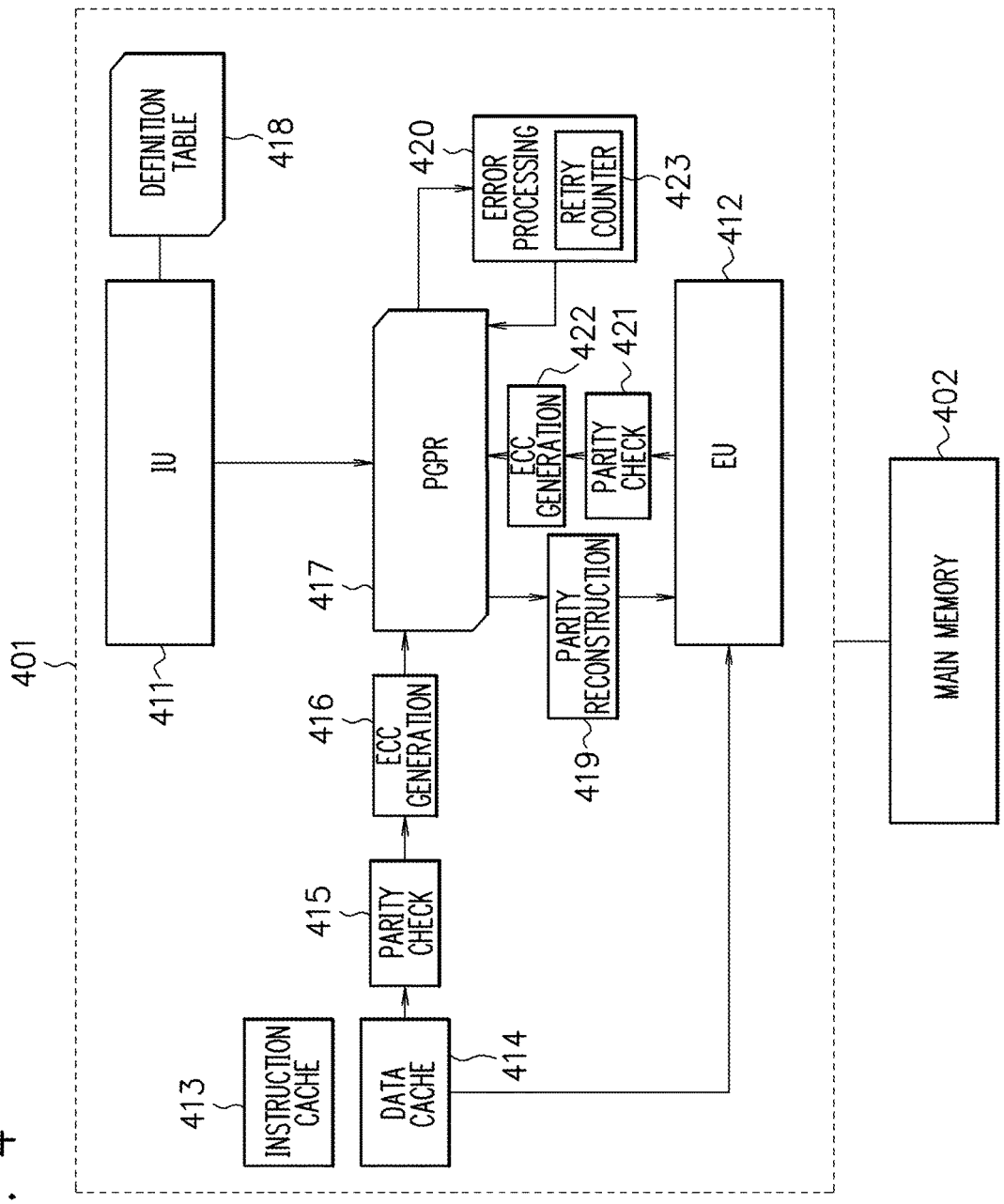
FIG. 4 is a diagram illustrating a configuration example of a processor according to this embodiment.

FIG. 4 is a diagram illustrating a configuration example of a processor 401 according to this embodiment. The processor 401 is connected to a main memory 402 and includes an instruction control unit 411, an arithmetic unit 412, an instruction cache memory 413, a data cache memory 414, a first parity check circuit 415, a first error checking/correcting information generating circuit 416, a register 417, a definition table 418, a parity reconstruction circuit 419, an error processing circuit 420, a second parity check circuit 421, and a second error checking/correcting information generating circuit 422. The instruction control unit 411 is an instruction unit (IU). The arithmetic unit 412 is an execution unit (EU). The error processing circuit 420 includes a retry counter 423. The register 417 is a storage unit of a physical GPR (PGPR) and the one in which the work register (ROB) 116 and the general purpose register (GPR) 117 in FIG. 1 are combined into one register. This allows a reduction in an area and a power consumption of the processor 401.

FIG. 5A is a diagram illustrating the work register (ROB) 116, the general purpose register (GPR) 117, and an error processing circuit 118 in FIG. 1. The work register (ROB) 116 stores the pre-commit (before completion) data of the instruction control unit 111 as described above. The general purpose register (GPR) 117 stores the post-commit (after completion) data of the instruction control unit 111. The error processing circuit 118 performs the processing with respect to the post-commit data in the general purpose register (GPR) 117 as illustrated in FIG. 3.

FIG. 5B is a diagram illustrating the register (PGPR) 417, the instruction control unit 411, and the definition table 418 in FIG. 4. The register (PGPR) 417 is the one in which the work register (ROB) 116 and the general purpose register (GPR) 117 in FIG. 1 are combined into one register and stores pre-commit data of the instruction control unit 411 and post-commit data of the instruction control unit 411. The definition table 418 stores an address of the pre-commit data in the register (PGPR) 417 and an address of the post-commit data in the register (PGPR) 417 under control of the instruction control unit 411. The instruction control unit 411 refers to the definition table 418, commits (completes) the pre-commit data stored in the register (PGPR) 417 in instruction order, makes the register (PGPR) 417 store the pre-commit data as the post-commit data, and updates the definition table 418.

Here, a case where the error processing circuit 420 in FIG. 4 performs processing similar to that in FIG. 3 is explained. At Step S301, the error processing circuit 420 sequentially reads out all data in the register (PGPR) 417. That is, the error processing circuit 420 reads out both the pre-commit data and the post-commit data stored in the register (PGPR) 417. Note that the error processing circuit 420 is not capable of distinguishing between the pre-commit data and the post-commit data because it is not allowed to refer to the definition table 418. Here, as described above, there is a possibility that the pre-commit data includes invalid error data due to double load instructions or the like. In that case, there is a problem that the error processing circuit 420 proceeds via Steps S302 and S303 to Step S304 and transmits unnecessary system error information. Note that in a case in FIG. 5A, since the error processing circuit 118 reads out only the post-commit data in the general purpose register (GPR) 117, such a problem does not occur. Hereinafter, an embodiment for solving the problem is explained.

Figure 6:
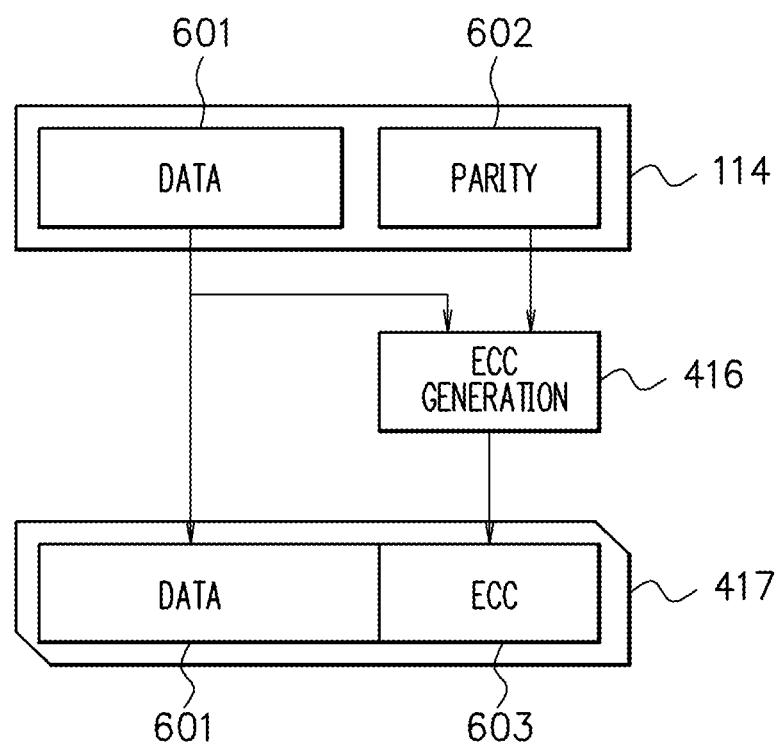
FIG. 6 is a diagram illustrating processing of a first error checking/correcting information generating circuit.

In FIG. 4, the instruction cache memory 413 stores some instructions of instructions stored in the main memory 402. The data cache memory 414 stores some data 601 of data stored in the main memory 402 and parity bits 602 as illustrated in FIG. 6. A 1-bit parity bit 602 is added to 8-bit data 601. The parity bits 602 are error check information for checking an error of the data 601.

The instruction control unit 411 reads out a load instruction stored in the instruction cache memory 413 and executes the load instruction in accordance with a program counter. Specifically, the instruction control unit 411 reads out the data 601 and parity bits 602 stored in the data cache memory 414 and writes the read-out data 601 and parity bits 602 in the register (PGPR) 417 via the first parity check circuit 415 and the error checking/correcting information generating circuit 416.

The first parity check circuit 415 is a first error check circuit, receives the data 601 and the parity bits 602, and checks the error of the data 601 based on the parity bits 602.

The first error checking/correcting information generating circuit 416 adds error checking/correcting information (ECC information) 603 to the data 601 to output to the register (PGPR) 417 as illustrated in FIG. 6 when the error is not detected by the first parity check circuit 415. The error checking/correcting information 603 is information for detecting the error of the data 601 and correcting the detected error. In addition, the first error checking/correcting information generating circuit 416 adds error uncorrectable information and the error checking/correcting information 603 to the data 601 to output to the register (PGPR) 417 when the error is detected by the first parity check circuit 415.

Specifically, the first error checking/correcting information generating circuit 416 generates, for example, 13-bit error checking/correcting information 603 based on 64-bit data 601 and 8-bit parity bits 602 when the error is not detected by the first parity check circuit 415. The error checking/correcting information 603 includes information of the parity bits 602 and is capable of reconstructing the parity bits 602. Then, the first error checking/correcting information generating circuit 416 outputs the 64-bit data 601 and the error checking/correcting information 603 to the register (PGPR) 417.

Further, the first error checking/correcting information generating circuit 416 generates, for example, the 13-bit error checking/correcting information 603 based on the 64-bit data 601 and the 8-bit parity bits 602 and adds the error uncorrectable information to the error checking/correcting information 603 by bit manipulation of the error checking/correcting information 603 when the error is detected by the first parity check circuit 415. For example, the first error checking/correcting information generating circuit 416 inverts all bits or two bits of the error checking/correcting information 603, thereby adding the error uncorrectable information to the error checking/correcting information 603. Because a probability of occurrence of a combination of bits in which all bits or two bits of the error checking/correcting information 603 are inverted is very low in a normal error (for example, a soft error), checking a combination of bits of the error checking/correcting information 603 makes it possible to judge whether or not the error uncorrectable information is added thereto. Thereafter, the first error checking/correcting information generating circuit 416 outputs the 64-bit data 601 and the 13-bit error checking/correcting information 603 to which the error uncorrectable information is added to the register (PGPR) 417. Note that the first error checking/correcting information generating circuit 416 may output the data 601, the error checking/correcting information 603, and the error uncorrectable information to the register (PGPR) 417.

The register (PGPR) 417 stores the data 601 to which the error checking/correcting information 603 is added when the error is not detected by the first parity check circuit 415. In addition, the register (PGPR) 417 stores the data 601 to which the error uncorrectable information and the error checking/correcting information 603 are added when the error is detected by the first parity check circuit 415.

The instruction control unit 411 commits the pre-commit data stored in the register (PGPR) 417 in instruction order, makes the register (PGPR) 417 store the pre-commit data stored in the register (PGPR) 417 as the post-commit data, and updates the definition table 418.

The register (PGPR) 417 stores the data 601 to which the error checking/correcting information 603 is added as the pre-commit data. The instruction control unit 411 is capable of performing out-of-order execution. In addition, for example, when the instruction control unit 411 executes double load instructions mistakenly, there is a case where data destruction is caused and invalid error data is written as the pre-commit data in the register (PGPR) 417. Therefore, the instruction control unit 411 commits only valid pre-commit data in the register (PGPR) 417 in instruction order and makes the register (PGPR) 417 store the pre-commit data as the post-commit data.

FIG. 7A, FIG. 7B, and FIG. 8 are flowcharts illustrating a control method of the processor 401 in FIG. 4. FIG. 7A is the flowchart illustrating the control method of the instruction control unit 411. FIG. 7B is the flowchart illustrating the control method of the arithmetic unit 412. FIG. 8 is the flowchart illustrating the control method of the error processing circuit 420.

First, at Step S701 in FIG. 7A, the instruction control unit 411 refers to the definition table 418 and determines a read address and a write address in the register (PGPR) 417 for performing an operation instruction. Next, at Step S702, the instruction control unit 411 issues the operation instruction including the read address and the write address to the arithmetic unit 412. The read address and the write address are addresses in the register (PGPR) 417.

Next, at Step S711 in FIG. 7B, the arithmetic unit 412 receives the operation instruction including the read address and the write address. Next, at Step S712, the arithmetic unit 412 reads out the data 601 to which the error checking/correcting information 603 is added from the address in the register (PGPR) 417 which the read address indicates via the parity reconstruction circuit 419. The parity reconstruction circuit 419 is an error check information reconstruction circuit, receives the data 601 and the error checking/correcting information 603 added to the data 601 which the arithmetic unit 412 read out from the register (PGPR) 417, reconstructs the parity bits 602, and outputs the parity bits 602 to the arithmetic unit 412.

Next, at Step S713, the arithmetic unit 412 checks an error of the data 601 based on the error checking/correcting information 603 added to the data 601, proceeds with processing to Step S716 when the error is not detected, and proceeds with processing to Step S714 when the error is detected.

At Step S716, the arithmetic unit 412 performs an operation based on the read-out data 601. Then, the arithmetic unit 412 writes data after the operation as pre-commit data in the address in the register (PGPR) 417 which the write address indicates via the second parity check circuit 421 and the second error checking/correcting information generating circuit 422 and updates the definition table 418.

The arithmetic unit 412 adds the above-described parity bits 602 to the data 601 after the operation when it is possible to succeed the above-described parity bits 602 with respect to the data 601 after the operation. Further, the arithmetic unit 412 adds new parity bits 602 to the data 601 after the operation when it is not possible to succeed the above-described parity bits 602 with respect to the data 601 after the operation.

The second parity check circuit 421 is a second error check circuit, receives the data 601 operated by the arithmetic unit 412 and the parity bits 602 corresponding to the data 601, and checks the error of the data 601 based on the parity bits 602.

The second error checking/correcting information generating circuit 422 adds the error checking/correcting information 603 to the data 601 to output to the register (PGPR) 417 similarly to FIG. 6 when the error is not detected by the second parity check circuit 421. In addition, the second error checking/correcting information generating circuit 422 adds error uncorrectable information and the error checking/correcting information 603 to the data 601 to output to the register (PGPR) 417 when the error is detected by the second parity check circuit 421.

Specifically, the second error checking/correcting information generating circuit 422 generates, for example, 13-bit error checking/correcting information 603 based on 64-bit data 601 and 8-bit parity bits 602 when the error is not detected by the second parity check circuit 421. Then, the second error checking/correcting information generating circuit 422 outputs the 64-bit data 601 and the error checking/correcting information 603 to the register (PGPR) 417.

In contrast, the second error checking/correcting information generating circuit 422 generates, for example, the 13-bit error checking/correcting information 603 based on the 64-bit data 601 and the 8-bit parity bits 602 and adds the error uncorrectable information to the error checking/correcting information 603 by the bit manipulation of the error checking/correcting information 603 when the error is detected by the second parity check circuit 421. For example, the second error checking/correcting information generating circuit 422 inverts all bits or two bits of the error checking/correcting information 603, thereby adding the error uncorrectable information to the error checking/correcting information 603. Thereafter, the second error checking/correcting information generating circuit 422 outputs the 64-bit data 601 and the 13-bit error checking/correcting information 603 to which the error uncorrectable information is added to the register (PGPR) 417. Note that the second error checking/correcting information generating circuit 422 may output the data 601, the error checking/correcting information 603, and the error uncorrectable information to the register (PGPR) 417.

The register (PGPR) 417 stores the data 601 to which the error checking/correcting information 603 is added, as the pre-commit data when the error is not detected by the second parity check circuit 421. In addition, the register (PGPR) 417 stores the data 601 to which the error uncorrectable information and the error checking/correcting information 603 are added, as the pre-commit data when the error is detected by the second parity check circuit 421.

Thereafter, the instruction control unit 411 commits the pre-commit data in the register (PGPR) 417, makes the register (PGPR) 417 store the pre-commit data as the post-commit data, and updates the definition table 418. In contrast, at Step S714, the arithmetic unit 412 transmits error information to the instruction control unit 411.

At Step S703 in FIG. 7A, the instruction control unit 411 judges whether or not to receive the error information in a certain time, proceeds with processing to Step S704 when the error information is received, and proceeds with processing to Step S705 when the error information is not received. At Step S704, the instruction control unit 411 indicates a start of error processing with respect to the error processing circuit 420 and returns the processing to Step S703.

The error processing circuit 420 starts processing in FIG. 8 when it receives the indication of the start of the error processing from the instruction control unit 411. At Step S801, the error processing circuit 420 sequentially reads out all the data 601 in the register (PGPR) 417. Next, at Step S801, the error processing circuit 420 checks the error of the read-out data 601 based on the error checking/correcting information 603 added to the read-out data 601. Then, the error processing circuit 420 proceeds with processing to Step S803 when the error is detected and proceeds with processing to Step S808 when the error is not detected.

At Step S803, the error processing circuit 420 judges whether the detected error is either of a correctable error and an uncorrectable error. For example, when the data 601 is a 1-bit error, the error processing circuit 420 is capable of detecting and correcting the error. Further, when the data 601 is a 2-bit error, the error processing circuit 420 is capable of detecting the error and incapable of correcting the error. In addition, when the data 601 is an error of 3 or more bits, the error processing circuit 420 is sometimes not capable of detecting the error. The error processing circuit 420 proceeds with processing to Step S804 when the detected error is the correctable error (1-bit error) and proceeds with processing to Step S805 when the detected error is the uncorrectable error (2-bit error). At Step S804, the error processing circuit 420 corrects the data 601 based on the error checking/correcting information 603 and proceeds with the processing to Step S808.

At Step S805, the error processing circuit 420 checks whether or not the error uncorrectable information is added to the data 601 in which the error is detected. Specifically, the error processing circuit 420 judges that the error uncorrectable information is added to the data 601 in which the error is detected when the error uncorrectable information is added to the error checking/correcting information 603 added to the data 601 in which the error is detected. For example, the error processing circuit 420 judges that the error uncorrectable information is added to the data 601 in which the error is detected when a combination of bits in the error checking/correcting information 603 is a combination in which a possibility of existing in a normal error is very low. The error uncorrectable information is added when the parity check circuit 415 or 421 detects the error, as described above. Then, the error processing circuit 420 proceeds with processing to Step S806 when the error uncorrectable information is not added to the data 601 in which the error is detected and proceeds with processing to Step S807 when the error uncorrectable information is added to the data 601 in which the error is detected.

At Step S806, the error processing circuit 420 transmits system error information via the instruction control unit 411 to the higher device. In contrast, at Step S807, the error processing circuit 420 ignores the data 601 in which the error is detected, does not transmit the system error information, and proceeds with processing to Step S808. When incorrect double load instructions cause destruction of the data 601, the data 601 is given the error uncorrectable information and stored in the register (PGPR) 417 as pre-commit data. Such invalid data is not committed by the instruction control unit 411. The error processing circuit 420 does not transmit the system error information at Step S807 when the error uncorrectable information is added, and therefore transmission of unnecessary system error information can be prevented.

At Step S808, the error processing circuit 420 judges whether or not to read out all the data 601 in the register (PGPR) 417. Then, when the error processing circuit 420 fails to read out all the data 601, it returns to Step S801, reads out the next data 601 in the register (PGPR) 417, and repeats the above-described processing. Further, when the error processing circuit 420 reads out all the data 601, it proceeds to Step S809.

Here, the reason why the error processing circuit 420 performs the above-described processing with respect to not only the data which the arithmetic unit 412 reads out at Step S712 in FIG. 7B but also all the data in the register (PGPR) 417 is explained. When the data which the arithmetic unit 412 reads out from the register (GPR) 417 at Step S712 is an error, there is a possibility that data generated based on the data of the error is stored in the register (PGPR) 417. A possibility that the data generated based on the data of the error is error data is high. That is, when the data which the arithmetic unit 412 reads out from the register (PGPR) 417 is an error, there is a possibility that other data in the register (PGPR) 417 is also an error. Therefore, the error processing circuit 420 performs the processing in FIG. 8 with respect to all the data in the register (PGPR) 417.

Note that other than the arithmetic unit 412 reads out data from the register (PGPR) 417, it is also capable of reading out data from the data cache memory 414 in order to speed up the processing.

At Step S809, the error processing circuit 420 increments a value of the retry counter 423. Note that an initial value of the value of the retry counter 423 is "0" (zero). Next, at Step S810, the error processing circuit 420 judges whether or not the value of the retry counter 423 is equal to or more than a set value (threshold value). Then, the error processing circuit 420 proceeds with processing to Step S811 when the value of the retry counter 423 is equal to or more than the set value (threshold value) and completes processing and transitions to processing at Step S715 in FIG. 7B when the value of the retry counter 423 is fewer than the set value (threshold value). At Step S811, the error processing circuit 420 transmits system error information via the instruction control unit 411 to the higher device.

At Step S715 in FIG. 7B, the arithmetic unit 412 waits for a certain time until the processing in the error processing circuit 420 in FIG. 8 is completed and thereafter returns the processing to Step S712. At Step S712, the arithmetic unit 412 reads out the data 601 in the register (PGPR) 417 which the read address indicates. The read-out data is error-corrected at Step S804 when the error uncorrectable information is not added thereto and is not error-corrected when the error uncorrectable information is added thereto. Next, at Step S713, the arithmetic unit 412 checks the error of the data 601 based on the error checking/correcting information 603 added to the data 601.

When the read-out data is error-corrected, the arithmetic unit 412 does not detect the error and performs the operation based on the read-out data 601 at Step S716. Then, the arithmetic unit 412 writes data after the operation as the pre-commit data in the address in the register (PGPR) 417 which the write address indicates via the second parity check circuit 421 and the second error checking/correcting information generating circuit 422 and updates the definition table 418. In this case, at Step S703 in FIG. 7A, because there is no error reception in a certain time after the start indication of the error processing at Step S704 or until after initial instruction commit after an operation restart, the instruction control unit 411 proceeds with processing to Step S705. At Step S705, the instruction control unit 411 indicates reset of the retry counter 423 with respect to the error processing circuit 420. Just then, the error processing circuit 420 resets the value of the retry counter 423 to "0" (zero).

In contrast, when the read-out data is not error-corrected, the arithmetic unit 412 detects the error and at Step S714, transmits the error information to the instruction control unit 411. Thereby, the error processing circuit 420 repeats the above-described processing in FIG. 8. In this case, when the error uncorrectable information is added to the data 601 which the arithmetic unit 412 reads out at Step S712, the error processing circuit 420 increments the value of the retry counter 423 at Step S809. This processing is repeated, and then the value of the retry counter 423 becomes equal to or more than the set value (threshold value), and the error processing circuit 420 transmits the system error information at Step S811 and completes the processing. As described above, when the value of the retry counter 423 becomes equal to or more than the set value, the error processing circuit 420 transmits the system error information and completes the processing, thereby allowing prevention of infinite loop processing.

The above-described value of the retry counter 423 corresponds to the number of times at which the arithmetic unit 412 detects the error at Step S713. That is, at Steps S809 to S811, the error processing circuit 420 counts the number of times at which the arithmetic unit 412 detects the error, and transmits the system error information when the number of times at which the arithmetic unit 412 detects the error becomes equal to or more than the set value (threshold value).

Figure 9:
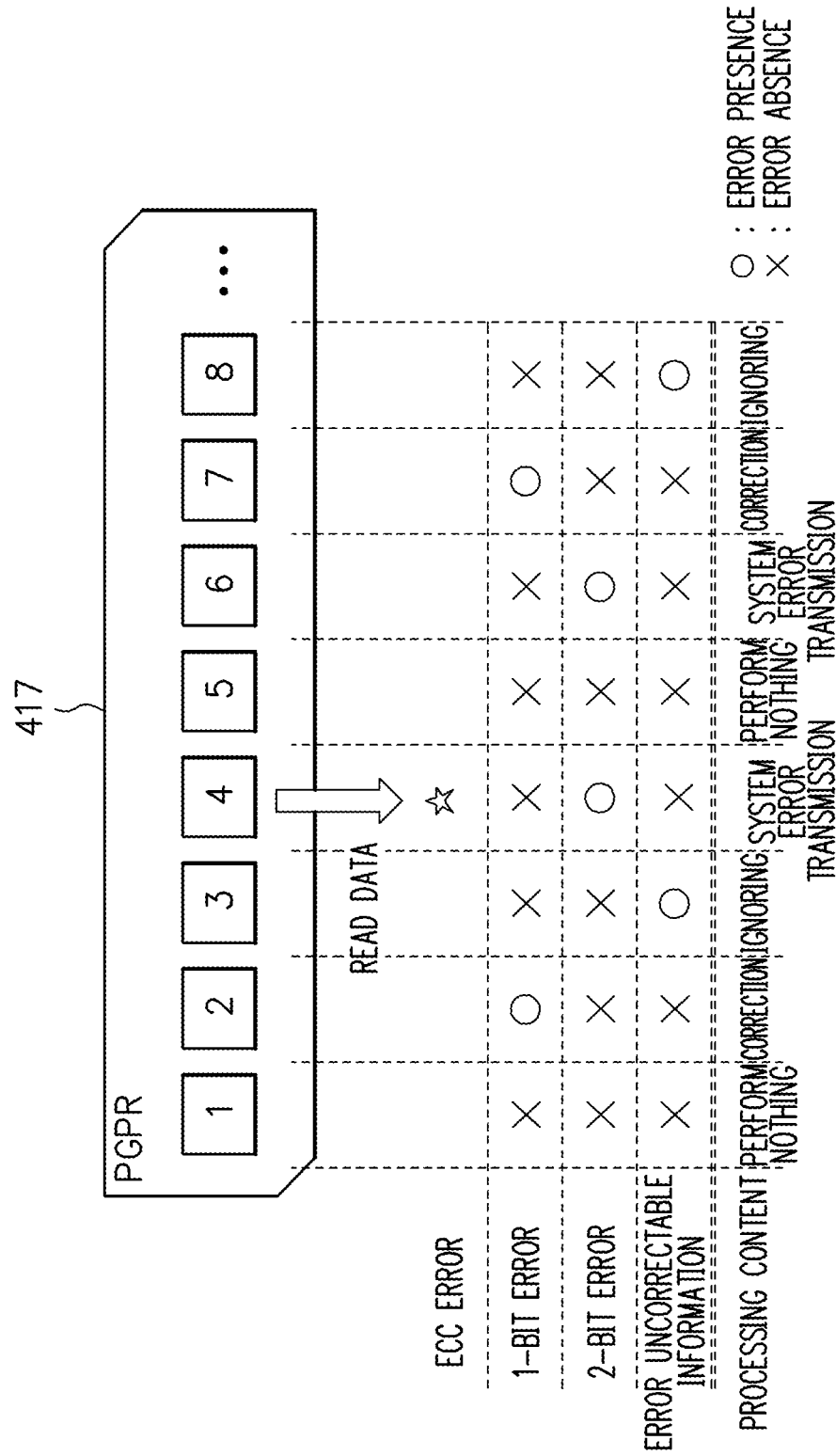
FIG. 9 is a diagram illustrating a specific example of a control method of the processor in FIG. 4.

FIG. 9 is a diagram illustrating a specific example of a control method of the processor 401 in FIG. 4. The register (PGPR) 417 stores data of a first to an eighth entries, for example. At Step S712, the arithmetic unit 412 reads out data 601 of the fourth entry from the register (PGPR) 417. At Step 713, the arithmetic unit 412 performs an error check based on error checking/correcting information 603 added to the data 601 of the fourth entry and detects an error. Just then, at Step S801, the error processing circuit 420 sequentially reads out all the data 601 of the first to the eighth entries in the register (PGPR) 417.

With respect to the data 601 of the first and the fifth entries, because an error is not detected, the error processing circuit 420 proceeds from Step S801 to S808 and performs nothing. Further, with respect to the data 601 of the second and the seventh entries, because a 1-bit error is detected, the error processing circuit 420 corrects the error at Step S804. Further, with respect to the data 601 of the third and the eighth entries, because an uncorrectable error is detected and error uncorrectable information is added, the error processing circuit 420 ignores the data 601 at Step S807. In addition, with respect to the data 601 of the fourth and the sixth entries, because a 2-bit error is detected and the error uncorrectable information is not added, the error processing circuit 420 transmits system error information at Step S806.

As described above, in this embodiment, since the pre-commit data and the post-commit data can be stored in one register (PGPR) 417, an area and a power consumption of the processor 401 can be reduced. Further, the error processing circuit 420 is capable of preventing transmission of unnecessary system error information when the error uncorrectable information is added to the data 601. In addition, the error processing circuit 420 is capable of preventing the infinite loop processing by transmitting the system error information when the value of the retry counter 423 is equal to or more than the set value.

It should be noted that the above-described embodiments all only illustrate examples of embodiments in carrying out the present invention and should not be construed as limiting the technical scope of the present invention. That is, the present invention can be embodied in a variety of forms without departing from its technical idea or its main features.

In one aspect, making one storage unit store data before completion and data after completion makes it possible to suppress an increase in an area and a power consumption. In addition, transmission of unnecessary error information can be prevented when error uncorrectable information is added.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A processor comprising:
   a first error check unit configured to check an error of received data based on error check information;
   a first error checking and correcting information generating unit configured to add error checking and correcting information and error uncorrectable information to the received data to output when the first error check unit detects an error and configured to add error checking and correcting information to the received data to output when the first error check unit does not detect an error;
   a storage unit configured to store data to which the error checking and correcting information and the error uncorrectable information are added when the first error check unit detects an error and configured to store data to which the error checking and correcting information is added when the first error check unit does not detect an error;

an instruction control unit configured to store data after completion in the storage unit in instruction order when data before completion which the storage unit stores is completed;

an arithmetic unit configured to read out data which the storage unit stores, configured to check an error of the read-out data based on the error checking and correcting information added to the read-out data, and configured to perform an operation based on the read-out data when an error is not detected; and a processing unit configured to read out all data which the storage unit stores and configured to check an error of each piece of read-out data based on error checking and correcting information added to each piece of all the read-out data when the arithmetic unit detects an error, and configured to correct data in which an error is detected based on the error checking and correcting information when a correctable error is detected.

2. The processor according to claim 1,
wherein the arithmetic unit is configured to check whether the error uncorrectable information is added to data in which the error is detected when an uncorrectable error is detected, configured to transmit error information when the error uncorrectable information is not added, and configured not to transmit error information when the error uncorrectable information is added.

3. The processor according to claim 1,
wherein after correction of data by the processing unit, the arithmetic unit is configured to read out data which the storage unit stores, configured to check an error of the read-out data based on the error checking and correcting information added to the read-out data, and configured to perform an operation based on the read-out data when an error is not detected, and
wherein the processing unit is configured to count a number of times at which the arithmetic unit detects an error, and configured to transmit error information when the number of times at which the arithmetic unit detects an error becomes equal to or more than a threshold value.

4. The processor according to claim 1, further comprising
a data cache memory unit configured to store the data to which the error check information is added,
wherein the instruction control unit is configured to write the data stored in the data cache memory unit as data before completion in the storage unit via the first error check unit and the first error checking and correcting information generating unit in response to an instruction.

5. The processor according to claim 1, further comprising
a table unit configured to store an address of data before completion in the storage unit and an address of data after completion in the storage unit,
wherein the instruction control unit is configured to refer to the table unit, configured to make the storage unit store data before completion stored in the storage unit as data after completion, and configured to update the table unit.

6. The processor according to claim 5,
wherein the instruction control unit is configured to refer to the table unit and configured to issue an operation instruction including an address, and
wherein the arithmetic unit is configured to receive the operation instruction including the address and configured to read out data in the address from the storage unit.

7. The processor according to claim 1, wherein the first error checking and correcting information generating unit is configured to generate the error checking and correcting information based on the data and the error check information, further comprising an error check information reconstruction unit configured to reconstruct the error check information based on the data and the error checking and correcting information added to the data which the arithmetic unit read out from the storage unit.

8. The processor according to claim 1,
wherein the arithmetic unit is configured to output the operated data and error check information corresponding to the data, further comprising:
a second error check unit configured to check an error of data which the arithmetic unit operates based on error check information; and
a second error checking and correcting information generating unit configured to add error checking and correcting information and error uncorrectable information to data which the arithmetic unit operates to output when the second error check unit detects an error and configured to add error checking and correcting information to data which the arithmetic unit operates to output when the second error check unit does not detect an error,
wherein the storage unit is configured to store the data to which the error checking and correcting information and the error uncorrectable information are added when the second error check unit detects an error and configured to store the data to which the error checking and correcting information is added when the second error check unit does not detect an error.

9. The processor according to claim 1,
wherein the error uncorrectable information is added by bit manipulation of the error checking and correcting information.

10. A control method of processor comprising:
a first error check unit which the processor includes checking an error of received data based on error check information;
a first error checking and correcting information generating unit which the processor includes adding error checking and correcting information and error uncorrectable information to the received data to output when the first error check unit detects an error and adding error checking and correcting information to the received data to output when the first error check unit does not detect an error;
a storage unit which the processor includes storing data to which the error checking and correcting information and the error uncorrectable information are added when the first error check unit detects an error and storing data to which the error checking and correcting information is added when the first error check unit does not detect an error;
an instruction control unit which the processor includes storing data after completion in the storage unit in instruction order when data before completion which the storage unit stores is completed;
an arithmetic unit which the processor includes reading out data which the storage unit stores, checking an error of the read-out data based on the error checking and correcting information added to the read-out data, and performing an operation based on the read-out data when an error is not detected; and a processing unit which the processor includes reading out all data which the storage unit stores and checking an error of each piece of read-out data based on error checking and correcting information added to each piece of all the read-out data when the arithmetic unit detects an error, and correcting data in which an error is detected based on the error checking and correcting information when a correctable error is detected.

* * * * *